United States Patent [19]
Hulvey

[11] Patent Number: 5,940,137
[45] Date of Patent: Aug. 17, 1999

[54] SYMBOL TIMING GENERATION AND RECOVERY FOR DATA TRANSMISSION IN AN ANALOG VIDEO SIGNAL

[75] Inventor: Robert W. Hulvey, Hermosa Beach, Calif.

[73] Assignee: TRW Inc., Redondo Beach, Calif.

[21] Appl. No.: 08/795,883

[22] Filed: Feb. 6, 1997

Related U.S. Application Data

[60] Provisional application No. 60/012,890, Mar. 1, 1996.

[51] Int. Cl.⁶ .............................. H03L 7/00; H04N 7/08; H04N 9/45
[52] U.S. Cl. ........................ 348/549; 348/473; 348/505; 348/508; 348/537
[58] Field of Search ..................... 348/423, 461, 348/464, 505, 507, 508, 512, 536, 537, 539, 462, 467, 468, 473, 478, 509, 510, 5, 723

[56] References Cited

U.S. PATENT DOCUMENTS

| | | | |
|---|---|---|---|
| 3,838,444 | 9/1974 | Loughlin et al. | 178/5.2 R |
| 3,984,624 | 10/1976 | Waggener | 178/56 |
| 4,078,245 | 3/1978 | Johnson et al. | 358/86 |
| 4,119,999 | 10/1978 | Gallo | 358/4 |
| 4,191,969 | 3/1980 | Briand et al. | 358/145 |
| 4,237,484 | 12/1980 | Brown et al. | 358/142 |
| 4,363,002 | 12/1982 | Fuller | 331/1 |
| 4,413,281 | 11/1983 | Thonnart | 358/147 |
| 4,561,100 | 12/1985 | Asao et al. | 375/99 |
| 4,652,834 | 3/1987 | McAdam | 329/50 |
| 4,694,327 | 9/1987 | Demmer et al. | 358/19 |
| 4,700,217 | 10/1987 | Balaban et al. | 358/23 |
| 4,799,102 | 1/1989 | Kobayashi | 358/23 |
| 4,977,445 | 12/1990 | Kawai | 358/17 |
| 5,196,921 | 3/1993 | Megeid | 358/19 |
| 5,229,847 | 7/1993 | Gibson | 358/12 |
| 5,237,412 | 8/1993 | Nakajima | 358/147 |
| 5,278,637 | 1/1994 | Naimpally | 358/12 |
| 5,294,982 | 3/1994 | Salomon et al. | 348/461 |
| 5,309,235 | 5/1994 | Naimpally | 348/476 |
| 5,311,311 | 5/1994 | Harigai et al. | 348/476 |
| 5,325,127 | 6/1994 | Dinsel | 348/473 |
| 5,371,548 | 12/1994 | Williams | 348/478 |
| 5,387,941 | 2/1995 | Montgomery et al. | 348/473 |
| 5,539,471 | 7/1996 | Myhrvold et al. | 348/473 |
| 5,566,212 | 10/1996 | Boytim et al. | 375/333 |
| 5,703,656 | 12/1997 | Shreve et al. | 348/549 |
| 5,767,915 | 6/1998 | Hulvey | 348/509 |

FOREIGN PATENT DOCUMENTS 2 229 890  10/1990  United Kingdom ........... H04N 7/087

Primary Examiner—John K. Peng
Assistant Examiner—Eric Ferguson
Attorney, Agent, or Firm—Michael S. Yatsko

[57] ABSTRACT

A video transmission system and method including a technique for deriving clock information in a receiver from a transmitted analog video signal to decipher digital data encoded on the video signal. A phase-locked loop in the transmitter is used to phase-lock a color burst subcarrier in the video signal to a local oscillator in the phase-locked loop to phase-lock a data clock to the subcarrier. A phase-locked loop in the receiver is also used to phase-lock the subcarrier of the transmitted video signal to a local oscillator in the phase-locked loop to again phase-lock a data clock to the subcarrier. By phase-locking a data clock to the subcarrier in both the transmitter and receiver, the data clock and the receiver can be synchronized to the data clock and the transmitter to provide for effective digital data recovery without the use of additional data bits for clock phase information.

13 Claims, 3 Drawing Sheets

SYMBOL TIMING GENERATION AND RECOVERY FOR DATA TRANSMISSION IN AN ANALOG VIDEO SIGNAL

This application claims benefit of provisional application No. 60/012,590 filed Mar. 01, 1996.

BACKGROUND OF THE INVENTION

1. Field of the Invention

This invention relates generally to the recovery of digital data from an analog video signal and, more particularly, to the recovery of digital data from an analog video signal by using a color subcarrier in the video signal for clock synchronization in the transmitter and the receiver.

2. Discussion of the Related Art

Various video transmission systems, such as cable television, closed circuit television, etc. utilize a transmitter to transmit an analog video signal, and a receiver to receive the analog video signal and convert it to an appropriate signal for viewing. Most of these transmission systems use data encoding schemes to encode digital data and/or data bit symbols onto the analog video signal for many things such as descrambling authorization, on-screen displays, teletext, auxiliary capabilities, closed caption, etc. When digital data is encoded onto an analog video signal, some procedure must be provided to synchronize the transmitted digital data with a clock signal in the receiver for data recovery. This technique is generally referred to as "bit synchronization," and is typically achieved by phase-locking a local clock source in the receiver with clock phase information transmitted with the digital data.

Typically, the digital data transmission format is of a data burst nature, where there are relatively long intervals of time between sequences of digital data in the analog signal. In this context, data burst refers to sequences or groups of digital data between intervals of no data in the analog signal without data. Color burst is a term of art that refers to the 8 to 10 cycles of sine wave at the beginning of each line of video used to derive color demodulation information for each segment of video information. Generally, the digital data is transmitted in the vertical blanking interval of the video signal. The vertical blanking interval is a segment of the analog video signal at the beginning of each video field that does not include video data. In this format the digital data bursts occur about 16 to 20 milliseconds apart.

For known video signal transmission systems, when digital data is transmitted in a burst format, some of the bits of data in each burst must be sacrificed to provide clock phase information since the receiver's data clock cannot accurately roll through the time intervals where no digital data is being received, and still be synchronized to the data. Because these digital data bits must be sacrificed to provide the clock phase information, these bits are not available to provide the desired information. Therefore, additional data bits are required beyond those bits that include the information. Because the portion of the analog video signal available to transmit digital data is limited, the digital data bits carrying the clock phase information may limit the amount of information that can be transmitted in each data burst.

What is needed is a bit synchronization technique that synchronizes the data bits in a transmitted analog video signal to a clock phase in the receiver so that the data information can be accurately extracted from the video signal, where the technique does not use data bits in the data information to provide clock phase information. It is therefore an object of the present invention to provide such a bit synchronization technique.

SUMMARY OF THE INVENTION

In accordance with the teachings of the present invention, a video transmission system and method is disclosed that includes a technique for deriving clock information in a receiver from a transmitted analog video signal to decipher digital data encoded on the video signal. In one embodiment, the digital data is encoded in a vertical blanking interval of the video signal. A phase-locked loop in the transmitter is used to phase-lock a color burst subcarrier in the video signal to a local oscillator in the phase-locked loop to phase-lock a data clock to the subcarrier. A phase-locked loop in the receiver is also used to phase-lock the subcarrier of the transmitted video signal to a local oscillator in the phase-locked loop to again phase-lock a data clock to the subcarrier. By phase-locking a data clock to the subcarrier in both the transmitter and the receiver, the data clock in the receiver can be synchronized to the data clock in the transmitter to provide for effective digital data recovery without the use of additional data bits for clock phase information.

In one particular embodiment, the digital data is Manchester coded in the transmitter, and Manchester demodulated in the receiver to provide for effective data transitions. Further, a "Barker" code is added to the digital data stream to provide an indication of the beginning of the digital data sequence. A lead-in string of zeros precedes the digital data and Barker code in the digital data sequence, and a zero detect circuit in the receiver detects the string of zeros to synchronize the subcarrier transmitted on the transmitted video signal with the data clock in the receiver to distinguish between a correct phase data clock in the receiver and an inverted phase data clock.

Additional objects, advantages and features of the present invention will become apparent from the following description and appended claims, taken in conjunction with the accompanying drawings.

DETAILED DESCRIPTION OF THE PREFERRED EMBODIMENTS

The following description of the preferred embodiments directed to a bit synchronization and recovery technique for digital data bits encoded on an analog video signal in a transmitter and receiver is merely exemplary in nature and is in no way intended to limit the invention or its applications or uses.

Figure 1:
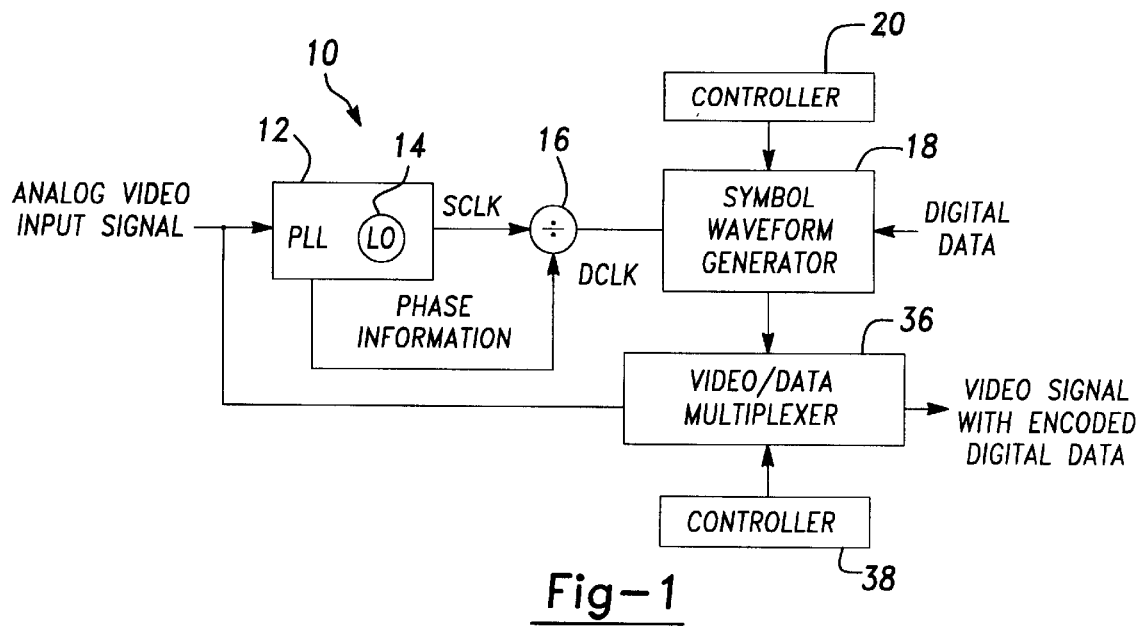
FIG. 1 is a block diagram of a portion of a transmitter that encodes digital data onto an analog video signal for transmission according to one embodiment of the present invention.

FIG. 1 shows a block diagram of a portion of a transmitter 10 that transmits an analog video signal having encoded digital data. The analog video signal may be of the type transmitted for various applications, such as cable television, and may be formatted in many different known types of video signal formatting, such as NTSC (National Television System Committee), PAL (Phase Alternating by Line), SECAM (Sequential Couleur Avec Memoire), all known to those skilled in the art. In a particular application, the portion of the transmitter 10 shown is a scrambler that scrambles the digital data onto the analog video signal for various reasons, such as signal reception authorization.

Figure 2:
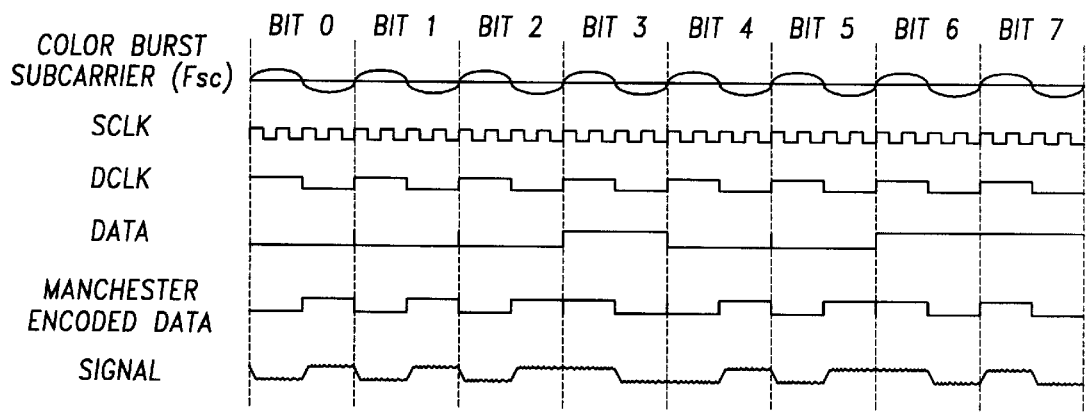
FIG. 2 shows a series of signal lines for various signals in the transmitter of FIG. 1.

An analog video input signal carrying video information for transmission to be subsequently displayed after transmission and reception, and that does not include the encoded digital data bits, is applied to a phase-locked loop (PLL) 12. The PLL 12 includes a variable controlled oscillator 14 acting as a local oscillator that is phase-locked by the PLL 12 to the phase of the sine wave color burst subcarrier signal provided at the beginning of each line of video information in the analog video signal. The use of color burst subcarrier signals for providing color information in the analog video signal is well understood to those skilled in the art. FIG. 2 depicts a color burst subcarrier signal having a frequency Fsc. Locking a color burst subcarrier signal to a local oscillator in a phase-locked loop has heretofore been described in U.S. patent application Ser. No. 08/571,018, titled Digital Phase Error Detector for Locking to Color Subcarrier of Video Signals, filed Dec. 12, 1995, assigned to the assignee of this application, and herein incorporated by reference. The PLL 12 produces a square wave output signal referred to as a sample clock (SCLK) signal that is phase-locked to the variable controlled oscillator 14 and has a frequency four times the frequency Fsc of the subcarrier to be adequate for video sampling. The SCLK signal is also depicted in FIG. 2.

As discussed above, the variable controlled oscillator 14 in the PLL 12 is phase-locked to a subcarrier present in the analog video signal. In the described embodiment, the variable controlled oscillator 14 maintains a frequency of four times the subcarrier frequency Fsc, however, other denominations of the subcarrier frequency Fsc can also be used to provide the SCLK signal. For PAL and NTSC signals, the subcarrier frequency may be the chrominance subcarrier, known to those skilled in the art, which can be derived from the color burst signal contained in the video signal. For SECAM signals, this frequency may be either of the chrominance subcarriers (B-Y or R-Y), which are both transmitted at certain points in the analog video signal.

The SCLK signal from the PLL 12 is applied to a divider 16. A phase information signal from the PLL 12 is also applied to the divider 16 to provide a more accurate phase relationship between the SCLK signal and the output of the divider 16. The divider 16 divides the SCLK signal by eight to provide a data clock (DCLK) signal that is phase-locked to the variable controlled oscillator 14 of the PLL 12, and provides a slow enough clock rate adequate for data encoding. The DCLK signal is therefore appropriate for applying digital data to the analog signal. The DCLK signal can have one of two possible phases relative to the carrier frequency Fsc, inverted or non-inverted. The DCLK signal is also depicted in FIG. 2. The divider 16 can divide the SCLK by other appropriate divisions, to provide symbol periods within the space of one chrominance subcarrier. This provides a ready source for a symbol (digital data) clock in the transmitter 10.

Since the DCLK signal is one-eighth the frequency of the SCLK in the transmitter 10, there is an ambiguity of eight possible phases in the DCLK signal. This is mitigated by the design of the variable controlled oscillator 14 in the PLL 12 which is used to synchronize the SCLK signal with the color subcarrier of the incoming video signal. Since the color subcarrier signal is used for the purpose of generating synchronized SCLK signals in both the transmitter 10 and a receiver circuit, both the transmitter 10 and the receiver circuit have access to internal signals required by the PLL 12. One of these required signals is a continuous clock which is a fixed phase relative to the color subcarrier. Since this signal is present in both the transmitter 10 and the receiver circuit, this allows a DCLK signal with only an ambiguity of two phases, that is, either inverted or non-inverted.

The DCLK signal is applied to a symbol waveform generator 18 that encodes digital data onto the analog input signal in-phase with the DCLK signal. The digital data that is to be encoded on the vertical blanking intervals of the analog video signal to encode the various descrambling authorizations, teletext, closed caption signals, etc. is applied to the waveform generator 18 from a suitable computer (not shown) that may control the operation of the transmitter 10. The symbol generator 18 knows when to apply the digital data to the DCLK signal by a control signal from a controller 20. The controller 20 may also be a computer that controls the operation of the transmitter 10, or can be any other suitable controller known to those skilled in the art for the purposes described herein.

The symbol waveform generator 18 provides the data with a run-in code of several zeros in a row, in order to allow the data recovery circuit to determine which of two ambiguous clock phases is the correct phase for bit recovery, as will be discussed below. Also, the symbol waveform generator 18 provides a 7-bit "Barker" code following the string of zeros. The Barker code is a fixed 7-bit sequence that is used to detect the beginning of each burst of data. The Barker code allows the detection circuit to determine the correct bit positions of all of the data bits in the data burst, since they are known relative to the Barker code.

Figure 3:
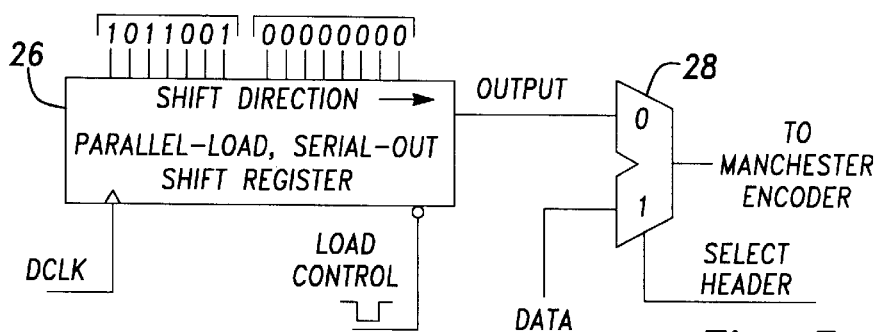
FIG. 3 is a logic circuit showing a Barker code and leading zero generator for providing a Barker code and leading zeros before the digital data in the transmitter of FIG. 1.

FIG. 3 shows a logic circuit of a Barker code and leading zero generator 24 for providing the Barker code following the string of zeros. The generator 24 includes a parallel-load, serial output shift register 26 that is a standard digital functional block, implemented by a series of registers with multiplexers between each register to select either the previous register output or an external input. At some time near the beginning of a video line of data, the register 26 is externally loaded with the predetermined Barker code (1011001) and a string of eight zeros. A load control input, from for example the controller 20, instructs the shift register 26 to output the Barker code and string of zeros at the appropriate time. The shift register 26 shifts out the string of zeros followed by the Barker code at the DCLK signal rate. The output from the shift register 26 is gated into the stream of digital data by a multiplexer 28. The multiplexer 28 is controlled by a select header signal, from for example the controller 20. The select header signal allows the multiplexer 28 to output the string of zeros, followed by the Barker code, followed by the digital data to a Manchester encoder, discussed below. Before and after the application of the select header signal, the output of the shift register 26 is not used and its value does not matter. The load control and the select header signals, as well as other miscellaneous control signals, are all generated by timing and control circuits within the transmitter 10, as would be understood to those skilled in the art.

Figure 4:
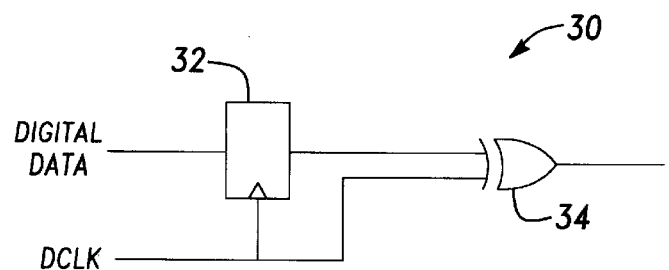
FIG. 4 is a logic circuit showing a technique for Manchester coding digital data in the transmitter of FIG. 1.

The digital data, Barker code and string of zeros is Manchester coded at the DCLK signal rate in the waveform generator 18. Manchester coding is a known digital data coding technique that guarantees suitable transitions between the data bits. Typically, Manchester coding is performed by exclusively ORing the data with the DCLK signal. FIG. 4 shows a logic circuit 30 depicting a technique for Manchester coding the data appropriate for the purposes described herein. In the circuit 30, the digital data is clocked into a flip-flop 32, acting as a 1-bit register, in sync with the DCLK signal. The digital data from the register 32 is applied to an XOR-gate 34 that exclusively ORs the digital data with the DCLK signal. Manchester coded digital data is then outputted from the XOR-gate 34. FIG. 2 gives an example of a data sequence and Manchester coded data relative to the DCLK signal.

By Manchester coding the digital data, the digital data has an average 50% duty cycle. Further, Manchester coding digital data provides many transitions in the digital data, allowing for a more accurate clock recovery, and allowing the digital data to be AC coupled where the data continues to switch symmetrically about its mean value independent of the digital data. If Manchester coding was not performed, long strings of zero's or one's would tend to drift toward the mean when AC coupled. Typically, digital data transmitted through RF channels is AC coupled at base band. For the application of the invention, Manchester coding provides a "data mean" which is independent of the video signal level. This is necessary for data inserted into video signals because the video signal is DC-restored by separate circuits within the data recovery circuit. If the mean was not established for the data, the data would be very sensitive to the signal level, or gain, of the base band video signal.

The Manchester coded digital data stream including the Barker code and leading zeros from the symbol wave generator 18 is then applied to a video/data multiplexer 36. The analog video input signal is also applied to the multiplexer 36. A control signal from a controller 38 is applied to the multiplexer 36 so that the multiplexer 36 knows when to multiplex the digital data stream onto the video input signal such as during the vertical blanking interval. The controller 38 can be part of the controller 20, or any type of suitable computer for the purposes described herein. An output of the multiplexer 36 is an analog video signal encoded with digital data including clocking information phase-locked to the color burst subcarrier frequency. The output of the multiplexer 36 is a data stream which consists of Manchester coded zeros followed by a Manchester coded Barker code followed by Manchester coded data that is multiplexed into one or more lines of video data in the vertical blanking interval of the analog video signal. This signal is applied to an antenna (not shown) for transmission, or other suitable transmission device. This output signal is also depicted in FIG. 2.

Figure 5:
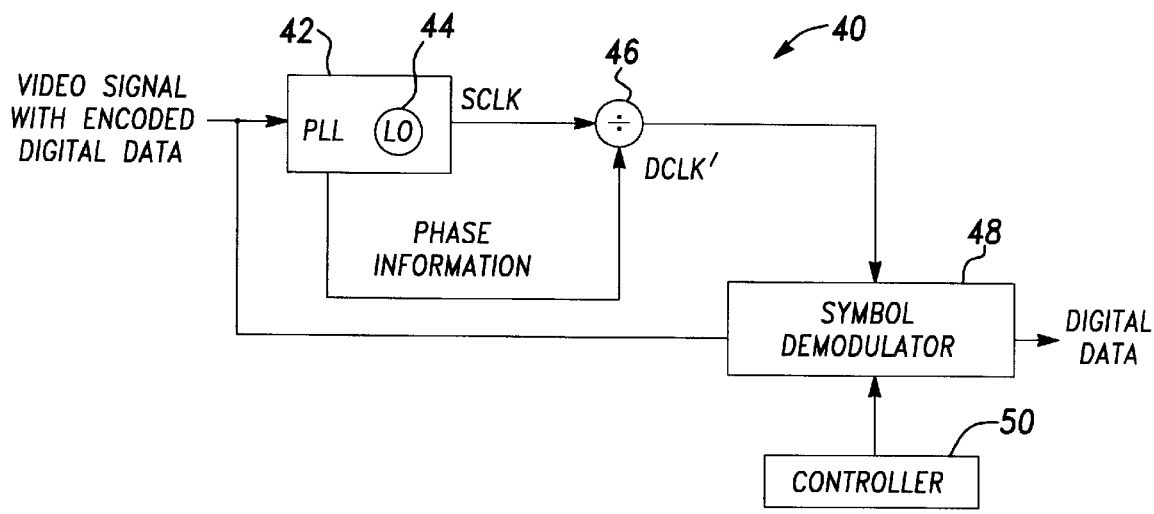
FIG. 5 is a block diagram of a portion of a receiver that decodes digital data encoded on the analog video signal according to an embodiment of the present invention.

FIG. 5 shows a block diagram of a portion of a receiver 40 that acts as a descrambler for descrambling and recovering the digital data encoded on the analog video signal transmitted from the transmitter 10. The video signal with encoded digital data is applied to a PLL 42 in the receiver 40. The PLL 42 phase-locks the subcarrier in the video signal to a variable controlled oscillator 44 acting as a local oscillator in the PLL 42. An SCLK signal from the PLL 42 is phase-locked to the local oscillator. The local oscillator in the PLL 42 is phase-locked to a subcarrier present in the video signal with encoded digital data in the same manner that the variable controlled oscillator 14 of the PLL 12 is phase-locked to the subcarrier in the analog video input signal.

The SCLK signal from the PLL 42 is applied to a divider 46 in the same manner that the SCLK signal from the PLL 12 is applied to the divider 16. In addition, a phase information signal is also applied from the PLL 42 to the divider 46. The divider 46 divides the SCLK signal in the same manner as the divider 16 to provide a DCLK' signal that is phase-locked to the variable controlled oscillator 44 in the PLL 42, and to the subcarrier frequency in the video signal. Because the subcarrier in the video signal applied to the PLL 12 is the same subearrier video signal applied to the PLL 42, the DCLK' signal from the divider 46 will be phase-locked to the DCLK signal from the divider 14. The specific phase of the DCLK' signal from the divider 46 may be inverted from the DCLK signal from the divider 16, and thus the DCLK signals may not be completely synchronized in a manner suitable for data recovery.

The DCLK' signal from the divider 44 and the video signal applied to the receiver 40 are applied to a symbol demodulator 48. The symbol demodulator 48 is controlled by a control signal from a controller 50. The controller 50 may be a suitable computer that controls the operation of the receiver 40, or can be any other suitable processor for the purposes described herein as would be apparent to those skilled in the art.

The symbol demodulator 48 includes various circuits for recovering the digital data from the video signal. One of those circuits is a zero detector circuit that is used to detect the string of zeros in the data stream and match the DCLK' signal in the receiver 40 to the DCLK signal in the transmitter 10. The string of zeros in the transmitted analog video signal may be inverted in the DCLK' signal in the receiver 40. A Manchester coded string of all zeros or all ones looks the same in that they both look like the original data clock (DCLK) signal. The only difference is which of the two data clock phases the symbol demodulator 48 chooses to look at. If the receiver 40 knows that a certain string is zeros, in particular, the first data bits encountered in a burst of data, it can then select the correct phase of the DCLK which would cause the demodulator 48 to output zeros for these bits. Then the rest of the data burst will also have the correct clock phase. If the bits coming out are ones, then the state of the data clock is inverted to be put in the correct phase. Such a technique is similar to the PAL switch discussed in U.S. patent application Ser. No. 08/592,745, filed Dec. 12, 1995, titled Digital Color Burst Phase Switch for PAL Video Systems, assigned to the assignee of the present application, and herein incorporated by reference.

Figure 6:
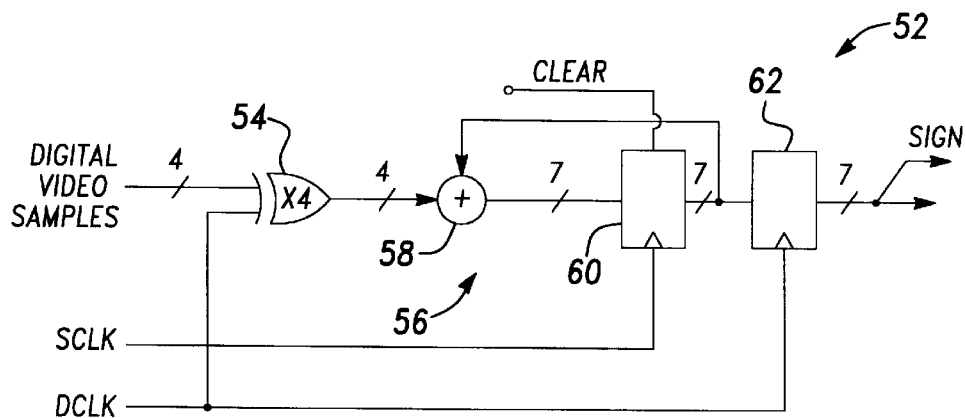
FIG. 6 is a logic circuit of a Manchester demodulator for demodulating Manchester coded data bits in the analog video signal applied to the receiver of FIG. 5.

The symbol demodulator 48 includes a Manchester demodulator 52 for demanchestering the Manchester coded digital data on the video signal, as shown in FIG. 6. The DCLK signal is used to clock the Manchester demodulator 52, and be in phase with the DCLK signal in the transmitter 10. The Manchester demodulator 52 includes a series of four XOR gates 54 that receive the top four digital video samples in the analog signal. Because there may be significant noise in the video signals, Manchester decoding may require more than just exclusively ORing the video signal. Therefore, the Manchester demodulator 52 includes logic for a soft decision for Manchester decoding. The outputs of each of the XOR gates 54 are applied to an accumulator 56 that includes an adder 58 and a register 60. The accumulator 56 is cleared at the start of each data bit by applying a clear signal to the register 60. A control circuit, such as the controller 50, may provide the clear signal. Seven outputs are applied from the adder 58 to the register 60. The register 60 is clocked at the faster SCLK signal rate such that the seven outputs from the adder 58 are clocked back into the adder 58 continually at this rate for each group of four data bits inputted into the adder 58. Therefore, the value in the adder 58 will be positive if the original four data bits were zero, or will be negative if the original four data bits were one. The outputs from the register 60 are applied to a register 62 which is clocked at the DCLK signal rate. The sign bit of the output of the register 62 is provided as the demodulated data, and the remaining bits are thrown away.

Figure 7:
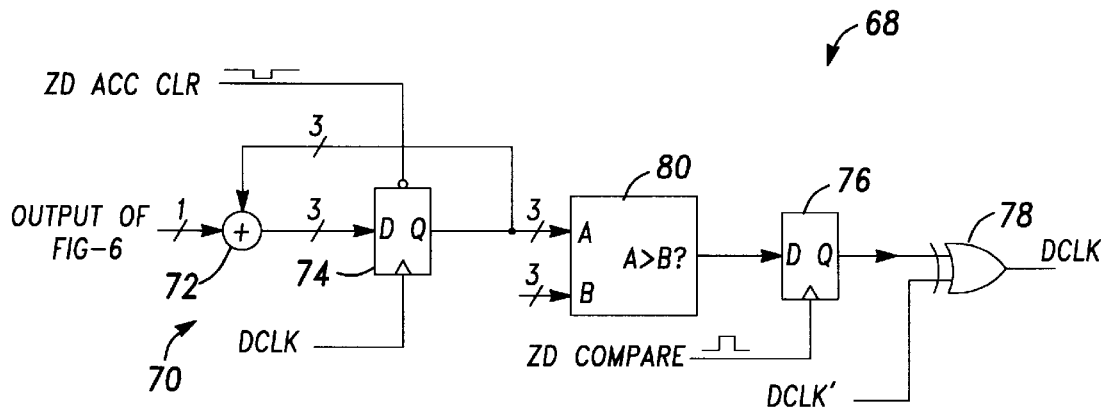
FIG. 7 is a logic circuit showing a zero detector for detecting zeros in the digital data received in the receiver shown in FIG. 5.

FIG. 7 shows a logic diagram of a zero detector 68 which performs the above described zero detection for determining the appropriate clock phase of the DCLK' signal in the receiver 40. It is the object of the zero detector 68 to then determine the correct phase of the DCLK signal which will be either in phase with DCLK' or 180 degrees out of phase with the DCLK' signal.

The de-manchestered data from the demodulator 52 is fed to an accumulator 70 which includes an adder 72 and a one bit zero detect accumulator register 74. The accumulator 70 adds up the number of ones which are received during a particular time interval during any of those horizontal lines in the video signal which may contain digital data to be received. This time interval is chosen to coincide with the expected position in the horizontal line of the transmitted string of zeros. In the preferred embodiment, a string of eight zeros is to be transmitted, as shown in FIG. 3. However, since there is some ambiguity with the position of the string of zeros in the received signal, the accumulation of the number of ones received is only performed for a duration of six bits to allow for some error in the bit positions.

Figure 8:
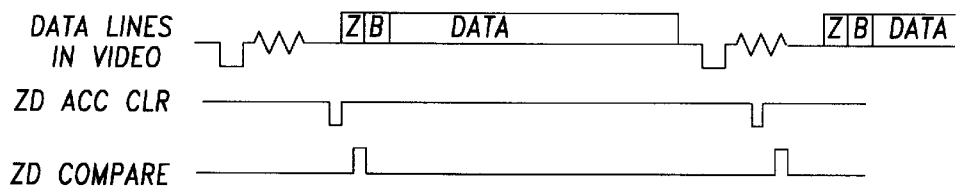
FIG. 8 is a timing diagram of the various timing signals of the zero detector of FIG. 7.

The accumulation time interval is preceded slightly by a clear signal which forces the zero detect accumulator register 74 to a value of zero. The clear signal will also clear a zero detect compare register 76. This will cause an XOR gate 78 to pass through the DCLK' signal to become the DCLK signal. Hence, DCLK' and DCLK will initially be in phase during the zero detect accumulation time interval. This same time interval is followed by a zero detect compare signal which causes the accumulated number of ones to be compared with a threshold value. The comparison is performed by a binary-weighted digital comparator 80, and the one-bit result is registered into the zero detect compare register 76. The relationship of the signals to each other and to the video signal is shown in FIG. 8. The data lines in video provides an original sync signal, followed by the color burst frequency signal, followed by the string of zeros, followed by the Barker code, followed by the data.

In the event that no noise-induced errors occur during the accumulation of the number of ones received, the accumulator 70 should contain a value of either zero, if all zeros were received, or six, if all ones were received. In the preferred embodiment, to allow for the possibility of noise-induced errors, and to provide some immunity to such errors, the number of ones received is compared to the number three. Thus, if four, five, or six ones are detected, then the string is assumed to contain "mostly ones," and therefor it is also assumed that the current phase of the DCLK signal is incorrect, and must be corrected. The comparison value registered into the zero detect compare register 76 will then be a one, and this will be used to invert the DCLK' signal using the XOR gate 78, thereby causing the DCLK' signal to be 180 degrees out of phase with DCLK If, on the other hand, zero, one, two or three ones are received, then it assumed that the string received contained "mostly zeros," and therefore it is also assumed that the current DCLK' phase is correct, and the DCLK and DCLK' signals will remain in phase. In this case, the compare register 76 will contain a zero, and the XOR gate 78 will allow DCLK' to pass through unchanged to become DCLK.

Figure 9:
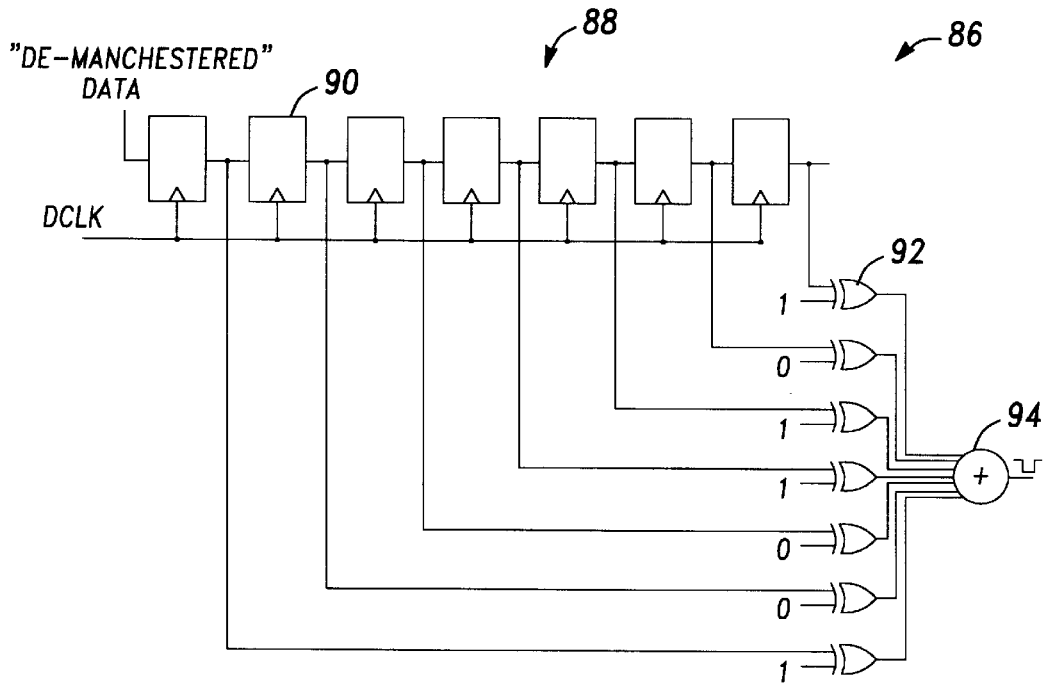
FIG. 9 is a logic circuit of a Barker code detector system for detecting a barker code in the video signal applied to the receiver of FIG. 5.

The symbol demodulator 48 also includes a Barker code detector for detecting the beginning of each 7-bit Barker code in the digital data. FIG. 9 shows a Barker code detector 86 that provides Barker code detection of the digital data after the digital data has been demanchestered. The detector 86 includes a seven bit shift register 88 including seven registers 90. The shift register 88 receives the demanchestered data at the input of the left-most register 90, and each register 90 is clocked by the DCLK signal. The output of each of the registers 90 is applied to an input of a separate XOR-gate 92. The other input to each XOR-gate 92 is the predetermined Barker code bit which should be in that position in the shift register 88. When the Barker code shows up in the shift register 88, the value of an adder 94 will be raised above a predetermined threshold indicating the beginning of a series of data bits. In one embodiment, the average energy of the zero detector with the energy of the Barker code detector is used to provide a longer Barker code, as well as increase its noise immunity.

The various logic circuit diagrams discussed above are shown by way of non-limiting examples to perform the particular function as described. In practice, however, there are several ways to implement the logic described. For example, a modern digital circuit may use a state machine with a lower gate count to implement these functions. A description of such a state machine would be much more complex than described because the various flip flops for gates would be contributing to more than one function.

By using the color burst subcarrier frequency in the video signal to provide the clock phasing information as described above, a number of advantages can be realized. For example, there is no need to use data bits simply for the purpose of recovering the phase of the data clock in the receiver 40. Also, since the color burst occurs more than 200 times as frequently as the digital data burst, it is more robust, and is more immune to noise in the channel than would be true of a data clock recovery method based only on a few bits included in the digital data burst.

It should be realized by one skilled in the art that, although the preferred embodiment described herein utilizes a string of zeros at the beginning of a data transmission to resolve the phase ambiguity of the DCLK signal in the receiver, one could obviously design a similar receiver utilizing a DCLK signal of twice the frequency of the DCLK signal described herein. In such a system, the data rate would be twice that of the system described herein as the preferred embodiment, and there would be a slight degradation in the bit error rate performance of the data transmission channel due to the higher data rate. However, there would be no need for the string of zeros, as there would be no phase ambiguity between the DCLK signal in the transmitter used to encode the data transmission and the DCLK signal in the receiver used to decode the data transmission. In such a system, the bit time would be identical to the period of once cycle the colorburst waveform. The phase of the colorburst signal is inherently known from the operation of the phase-locked loop circuit described earlier which synchronizes the system clock to the incoming colorburst signal.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A system for transmitting and receiving an analog video signal, said system comprising:

a first phase-locked loop, said first phase-locked loop phase-locking a first local oscillator to a subcarrier frequency in the video signal so as to generate a first phase-locked sample clock signal;

a waveform generator responsive to a first data clock signal based on the first sample clock signal and providing encoded digital data;

a video/data multiplexer responsive to the encoded digital data and the video signal and providing a video signal including the encoded digital data;

a second phase-locked loop, said second phase-locked loop being responsive to the video signal including the encoded digital data and phase-locking a second local oscillator to the subcarrier frequency in the video signal including the encoded digital data so as to generate a second phase-locked sample clock signal; and a demodulator responsive to a second data clock signal based on the second sample clock signal said demodulator including a detector that detects a string of zeros or ones in the encoded digital data so as to generate a phase orientation between the second data clock signal and the encoded digital data signal, said detector including an accumulator that accumulates data from the data bits in the encoded digital signal, said accumulator accumulating the data at the rate of the sample clock signal, said accumulated data providing a basis for the phase orientation between the second data clock signal and the encoded digital data signal, wherein said demodulator synchronizes the second data clock signal to the first data clock signal so as to extract the encoded digital data.

2. The system according to claim 1 wherein the waveform generator includes Manchester coding means for Manchester coding the encoded digital data so as to provide suitable transitions between data bits in the digital data.

3. The system according to claim 1 wherein the waveform generator includes a Barker code generator, said Barker code generator providing a known sequence of Barker code data bits at a beginning of a sequence of data bits in the encoded digital data.

4. The system according to claim 1 wherein the waveform generator includes a zero generator for providing a string of a known number of zero data bits at a beginning of a sequence of data bits in the encoded digital data.

5. The system according to claim 3 wherein the demodulator includes a Barker code detector, said Barker code detector detecting the Barker code data bits in the encoded digital data.

6. The system according to claim 1 wherein the subcarrier frequency in the video signal is a color burst frequency signal in the video signal used to derive color demodulation information.

7. The system according to claim 1 wherein the video/data multiplexer multiplexes the encoded digital data into a vertical blanking interval of the analog video signal.

8. A system for transmitting and receiving an analog video signal, said system comprising:

a first phase-locked loop, said first phase-locked loop phase-locking a first local oscillator to a subcarrier frequency in the video signal so as to generate a first phase-locked sample clock signal;

a waveform generator responsive to a first data clock signal based on the first sample clock signal and providing encoded digital data, said waveform generator including a Manchester coder that codes the encoded digital data;

a video/data multiplexer responsive to the encoded digital data and the video signal and providing a video signal including the encoded digital data;

a second phase-locked loop, said second phase-locked loop being responsive to the video signal including the encoded digital data and phase-locking a second local oscillator to the subcarrier frequency in the video signal including the encoded digital data so as to generate a second chase-locked sample clock signal; and a demodulator responsive to a second data clock signal based on the second sample clock signal, said demodulator synchronizing the second data clock signal to the first data clock signal so as to extract the encoded digital data, said demodulator including a Manchester demodulator to demodulate the Manchester coded digital data, said Manchester demodulator includes an accumulator that accumulates data from the digital data so as to provide a soft decision of the demodulation of the Manchester encoding.

9. A system for synchronizing a receiver data clock signal in a receiver with a transmitter data clock signal transmitted on an analog video signal including encoded digital data that is received by the receiver, said transmitter data clock signal being phase-locked to a subcarrier frequency in the video signal, said system comprising:

a phase-locked loop, said phase-locked loop being responsive to the video signal including the encoded digital data and phase-locking a local oscillator to the subcarrier frequency in the video signal, said phase-locked loop generating a sample clock signal phase-locked to the subcarrier frequency and having a rate faster than a rate of the subcarrier frequency; and a demodulator responsive to the receiver data clock signal, said receiver data clock signal based on the sample clock signal, said demodulator includes a detector that detects a string of zeros so as to generate a phase orientation between the receiver data clock signal and the transmitter data clock signal, said detector includes an accumulator that accumulates data from the string of zeros, said accumulator accumulating the data at the rate of the sample clock signal, said accumulated data providing a basis for the phase orientation between the receiver data clock signal and the transmitter data clock signal, wherein said demodulator synchronizes the receiver data clock signal to the transmitter data clock signal.

10. The system according to claim 9 wherein the encoded digital data on the video signal includes a sequence of data bits including the string of zeros, a predetermined code and subsequent data bits.

11. The system according to claim 9 wherein the subcarrier frequency is a color burst frequency signal in the video signal used to derive color demodulation information.

12. A method for transmitting and receiving an analog video signal, said method comprising the steps of:

phase-locking a first local oscillator to a subcarrier frequency in the video signal to generate a first phase-locked sample clock signal;

generating a first data clock signal phase-locked to the sample clock signal;

encoding digital data onto the analog signal at a rate of the first data clock signal, said encoded digital data including a string of zeros at the beginning of a sequence of data bits;

phase-locking a second local oscillator to the subcarrier frequency in the video signal to generate a second phase-locked sample clock signal;

generating a second data clock signal phase-locked to the second sample clock signal;

detecting the string of zeros in the encoded digital data so as to generate a phase orientation between the second data clock signal and the first data clock signal; and synchronizing the second data clock signal to the first data clock signal so as to extract the encoded digital data.

13. The method according to claim 12 wherein the subcarrier frequency in the video signal is a color burst frequency signal used to derive color demodulation information.

* * * * *